(12) United States Patent
Tsai et al.

(10) Patent No.: US 10,868,494 B2
(45) Date of Patent: Dec. 15, 2020

(54) DEVICE AND METHOD OF OPERATING THE SAME

(71) Applicant: TAIWAN SEMICONDUCTOR MANUFACTURING COMPANY LTD., Hsinchu (TW)

(72) Inventors: Ping-Han Tsai, New Taipei (TW); Chih-Sheng Hou, Taoyuan (TW); Po-Yu Chen, Hsinchu County (TW); Nan-Hsin Tseng, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 105 days.

(21) Appl. No.: 15/864,695

(22) Filed: Jan. 8, 2018

(65) Prior Publication Data

US 2019/0103835 A1 Apr. 4, 2019

Related U.S. Application Data

(60) Provisional application No. 62/566,119, filed on Sep. 29, 2017.

(51) Int. Cl.
*G04C 21/36* (2006.01)
*H03B 5/36* (2006.01)
*H03K 3/03* (2006.01)
*H03B 5/04* (2006.01)
*H03K 5/00* (2006.01)

(52) U.S. Cl.
CPC ..... *H03B 5/04* (2013.01); *H03K 2005/00032* (2013.01)

(58) Field of Classification Search
CPC .................. H03B 5/04; H03K 2005/00032
USPC .................. 331/57, 66, 108 A, 176
See application file for complete search history.

(56) References Cited

U.S. PATENT DOCUMENTS

| | | | |
|---|---|---|---|
| 5,197,033 A * | 3/1993 | Watanabe | G11C 5/14 365/189.07 |
| 2009/0257289 A1* | 10/2009 | Byeon | |
| 2010/0182852 A1* | 7/2010 | Joo et al. | |
| 2015/0303928 A1* | 10/2015 | Tang | H03L 1/00 331/66 |
| 2017/0288651 A1* | 10/2017 | Khare | H03K 3/0315 |

* cited by examiner

*Primary Examiner* — Richard Tan
(74) *Attorney, Agent, or Firm* — WPAT, P.C., Intellectual Property Attorneys; Anthony King

(57) ABSTRACT

A device includes a sensor and an oscillator. The sensor provides a temperature-sensitive voltage. The oscillator includes a digital delay cell and an adjustment device. The adjustment device, based on the temperature-sensitive voltage, adjusts a delay of the digital delay cell, wherein the digital delay cell produces, based on the adjusted delay, a signal at an oscillation frequency.

21 Claims, 11 Drawing Sheets

US 10,868,494 B2

DEVICE AND METHOD OF OPERATING THE SAME

PRIORITY CLAIM AND CROSS-REFERENCE

This application claims the benefit of provisional application Ser. 62/566,119 filed on Sep. 29, 2017, entitled "CIRCUIT" the disclosure of which is hereby incorporated by reference in its entirety.

BACKGROUND

In various circuit applications, heat dissipation plays an increasingly important role. With the high gate count and high operating frequency of modern system-on-a-chip (SoC) implementations, the thermal issue is escalated in prominence, especially for 2.5D or 3D integrated circuit (IC) applications. Some areas on a chip may be relatively hot and others may be relatively cool, and monitoring of the "hot spots" may be needed for effective circuit performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
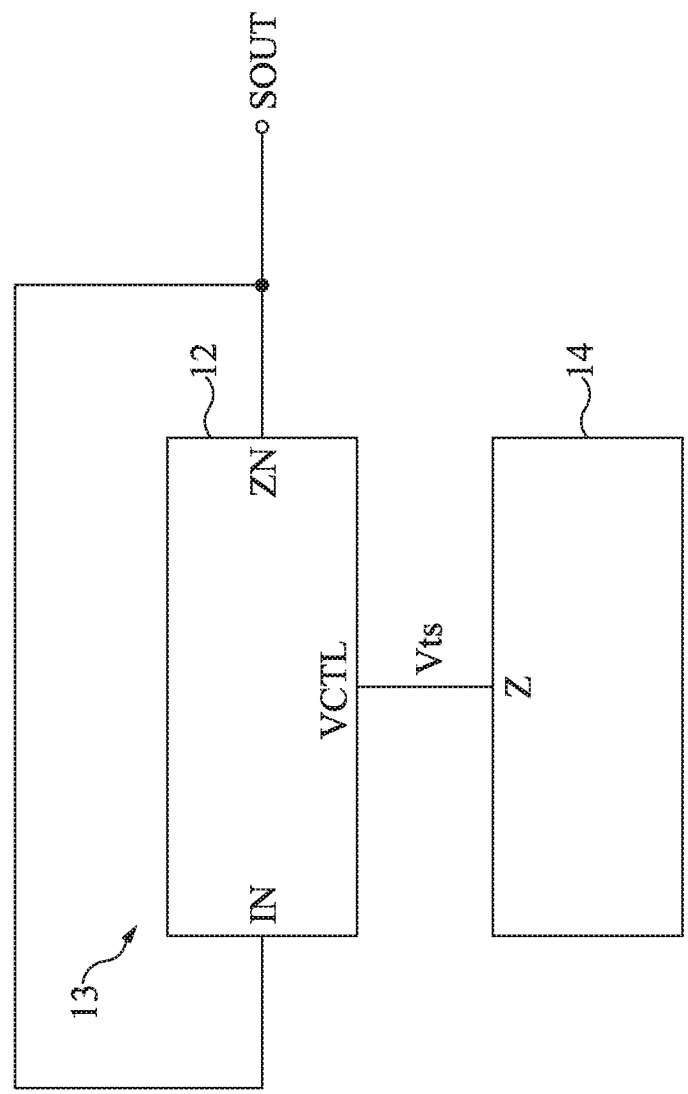
FIG. 1 is a schematic diagram of a device, in accordance with an embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of a device 1, in accordance with an embodiment of the present disclosure. Referring to FIG. 1, the device 1 includes a sensor 14 and an oscillator 12.

The sensor 14 functions to provide a temperature-sensitive voltage Vts to the oscillator 12 at its output (labeled "Z"). In the present embodiment, the temperature-sensitive voltage Vts is positively correlated to temperature. However, the present disclosure is not limited thereto. In some embodiments, the temperature-sensitive voltage Vts is negatively correlated to temperature. In an embodiment, the sensor 14 is enabled in response to an enable signal.

The oscillator 12 receives the temperature-sensitive voltage Vts at its voltage input (labeled "VCTL"), and produces, based on the temperature-sensitive voltage Vts, a signal SOUT at an oscillation frequency at its output (labeled "ZN"). Further, the oscillator 12 receives the signal SOUT at its input (labeled "IN"). The oscillation frequency and temperature have a linear relationship, which facilitates calculating temperature sensed by the sensor 14.

Moreover, the sensor 14 and the oscillator 12 are digital circuits, which will be illustrated in detail with reference to FIGS. 4, 6 and 7. As such, the device 10 is able to be formed within digital devices, such as central processing units (CPU) and graphics processing units (GPU). Consequently, the device 10 is able to accurately sense the temperature of the digital devices at any places of interest to a designer, which will be described in detail with reference to FIG. 9. Moreover, there is no need to prepare an analog-to-digital converter (ADC) which would otherwise be required by an analog sensor, such as a thermal diode, to convert an analog signal to a digital signal. Furthermore, size of the device 10 is relatively small, and therefore is area efficient.

In contrast, in some existing approaches, a thermal diode is adopted to sense temperature of digital devices. Typically, the thermal diode is an analog device. The analog device is required to be arranged far from the digital devices to avoid signal interference. Since the thermal diode is spaced apart from the digital devices by a relatively large distance, the thermal diode may not be able to accurately sense the temperature of the digital circuits, let alone a place of interest to a designer within the digital circuits. Furthermore, size of the thermal diode is relatively large, and therefore is area inefficient.

Figure 2:
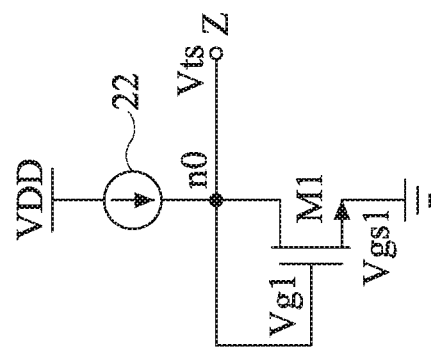
FIG. 2 is a schematic diagram of a sensor of the device shown in FIG. 1, in accordance with an embodiment of the present disclosure.

FIG. 2 is a schematic diagram of a sensor 14 of the device 10 shown in FIG. 1, in accordance with an embodiment of the present disclosure. Referring to FIG. 2, the sensor 14 includes a transistor M1 and a current source 22.

The transistor M1 is a diode-connected transistor, of which a drain is short-circuited to a gate. Moreover, the transistor M1 is controlled by the current source 22. A gate voltage of the transistor M1 serves as the temperature-sensitive voltage Vst. In the present embodiment, the transistor M1 is an NMOS (n-type metal-oxide-semiconductor) transistor. The present disclosure is not limited thereto. In some embodiments, the transistor M1 includes a PMOS (p-type metal-oxide-semiconductor) transistor. In some embodiments, the transistor M1 includes another suitable device, such as a field-effect transistor (FET), a power field-effect transistor (FET), a double-diffused metal-oxide-semiconductor (DMOS) transistor, an insulated-gate bipolar transistor (IGBT), etc.

The current source 22 functions to generate a current to flow through the transistor M1. In the present embodiment, magnitude of the current is independent of temperature.

In operation, the magnitude of the current generated by the current source 22 is kept unchanged as temperature increases. Contrarily, a threshold voltage of the transistor M1 increases as temperature increases. As such, a gate-to-source voltage Vgs1 of the transistor M1 increases as temperature increases. The gate-to-source voltage Vgs1 of the transistor M1 can be deemed as the gate voltage Vg1 of the transistor M1 since a source of the transistor M1 is short-circuited to a reference ground. As a result, the gate voltage Vg1 of the transistor M1 increases as temperature increases. Consequently, the sensor 14 provides a temperature-sensitive voltage Vts to the oscillator 12.

In another embodiment, magnitude of the current is temperature sensitive. Further, the magnitude of the current increases as temperature increases. As previously mentioned, the threshold voltage of the transistor M1 increases as temperature increases. Since both the magnitude of the current and the threshold voltage of the transistor M1 increase as temperature increases, the degree of increase in the gate-to-source Vgs1 of the transistor M1 is relatively significant. That is, the gate-to-source Vgs1 is more sensitive to temperature. As a result, temperature can be sensed relatively accurate.

A set of the current source 22 and the transistor M1 of the sensor 14 are each a standard cell in a digital circuit design. As such, the sensor 14 is able to be formed within digital devices, such as CPUs, GPUs. Consequently, the sensor 14 is able to accurately sense the temperature of the digital devices at any places of interest to a designer.

Figure 3:
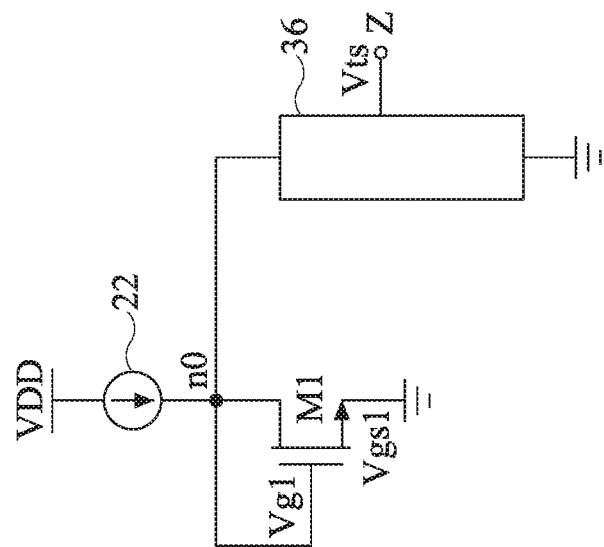
FIG. 3 is a schematic diagram of another sensor of the device shown in FIG. 1, in accordance with an embodiment of the present disclosure.

FIG. 3 is a schematic diagram of another sensor 34 of the device 10 shown in FIG. 1, in accordance with an embodiment of the present disclosure. Referring to FIG. 3, the sensor 34 is similar to the sensor 14 described and illustrated with reference to FIG. 2 except that, for example, the sensor 34 further includes a voltage divider 36.

The voltage divider 36 functions to transform the gate voltage Vg into the temperature-sensitive voltage Vts. In further detail, the voltage divide 36 decreases a voltage level of the gate voltage Vg, such that a voltage level of the temperature-sensitive voltage Vts falls within a voltage operation range of the oscillator 12. For example, the gate voltage Vg is 0.8 volts (V) and exceed an upper limit of a voltage operation range by 0.2V. If the oscillator 12 directly receives and utilizes the gate voltage of 0.8V, the oscillator may function abnormally. With the voltage divider 36, the gate voltage Vg is transformed to the temperature-sensitive voltage Vts whose voltage level falls within the voltage operation range of the oscillator 12.

Figure 4:
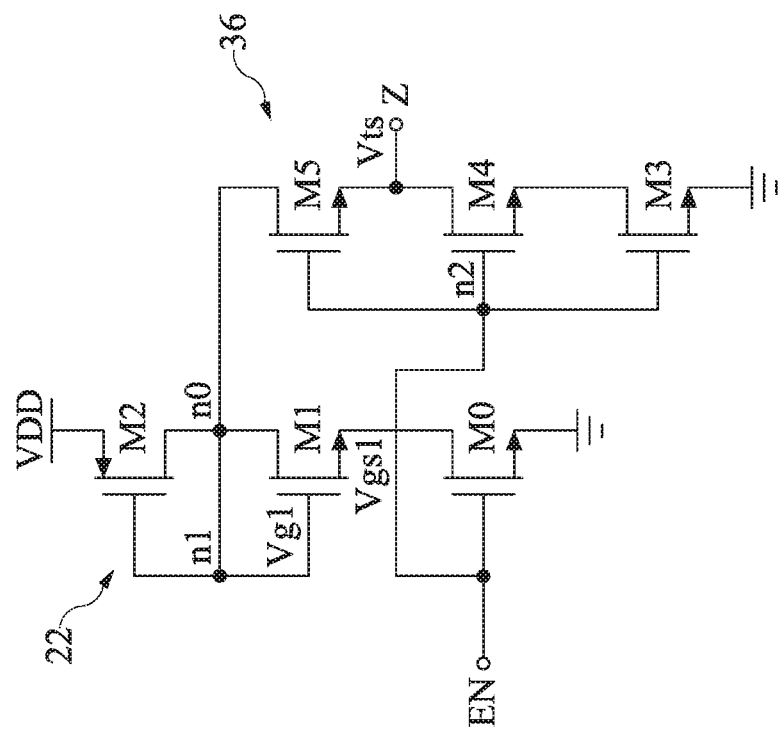
FIG. 4 is a circuit diagram of yet another sensor of the device shown in FIG. 1, in accordance with an embodiment of the present disclosure.

FIG. 4 is a circuit diagram of yet another sensor 44 of the device 10 shown in FIG. 1, in accordance with an embodiment of the present disclosure. Referring to FIG. 4, the sensor 44 is similar to the sensor 34 described and illustrated with reference to FIG. 3 except that, for example, the sensor 44 includes a transistor M0, the current source 22 includes a transistor M2, and the voltage divider 36 includes transistors M3, M4 and M5.

The transistor M0 serves as an activation device for activating the sensor 44. In further detail, in the present embodiment, the transistor M0 includes an NMOS transistor. A drain of the transistor M0 is directly connected to a source of the transistor M1. A source of the transistor M0 is connected to a reference ground. A gate of the transistor M0 receives an enable signal EN. When the enable signal EN is logically high, the transistor M0 is conducted. As such, a source of the transistor M1 can be deemed as being short-circuited to a reference ground. In some embodiments, the transistor M0 includes a PMOS transistor. In some embodiments, the transistor M0 includes another suitable device, such as an FET, a power FET, a DMOS transistor, an IGBT, etc. With the transistor M0, the sensor 44 can be activated when needed. There is no need to always keep the sensor 44 activated. As a result, the sensor 44 is relatively power efficient.

The transistor M2 is a diode-connected transistor. In the present embodiment, the transistor M2 includes a PMOS transistor. A source of the transistor M2 is connected to a supply voltage VDD. As such, the transistor M2 serves as a current source. Moreover, a drain of the transistor M2 is directly connected to a drain of the transistor M1. In some embodiments, the transistor M2 includes an NMOS transistor. In some embodiments, the transistor M2 includes another suitable device, such as an FET, a power FET, a DMOS transistor, an IGBT, etc. With the transistor M2 serving a current source generating a current controlling the transistor M1, the temperature-sensitive voltage Vts can be obtained as illustrated with reference to FIGS. 2 and 3.

The transistors M3, M4 and M5 are cascode connected. Gates of the transistor M3, M4 and M5 are controllable by the enable signal EN. In the present embodiment, the transistors M3, M4 and M5 include an NMOS transistor. A source voltage of the transistor M5, a top transistor of the voltage divider 36, serves as the temperature-sensitive voltage Vts. However, the present disclosure is not limited thereto. A source voltage of any of the transistors M3, M4 and M5 can be selected as the temperature-sensitive voltage Vts except for a source voltage of the lowest transistor of the voltage divider 36, depending on the voltage operation range of the oscillator 12. If the source voltage of the transistor M5 exceeds the voltage operation range, a source voltage of the transistor M4 may replace that of the transistor M5 as the temperature-sensitive voltage Vts. Furthermore, in the present embodiment, the amount of transistors adopted in the voltage divider 36 is three. However, the present disclosure is not limited thereto. The amount of transistors can be optimized based on the voltage operation range of the oscillator 12. With the transistors M3, M4 and M5, the gate voltage Vg of the transistor M1 is transformed to the voltage sensitive voltage Vts whose voltage level falls within the voltage operation range of the oscillator 12.

In some embodiments, the transistor M3 includes a PMOS transistor. In some embodiments, the transistor M3 includes another suitable device, such as an FET, a power FET, a DMOS transistor, an IGBT, etc.

In some embodiments, the transistor M4 includes a PMOS transistor. In some embodiments, the transistor M4 includes another suitable device, such as an FET, a power FET, a DMOS transistor, an IGBT, etc.

In some embodiments, the transistor M5 includes a PMOS transistor. In some embodiments, the transistor M5 includes another suitable device, such as an FET, a power FET, a DMOS transistor, an IGBT, etc.

Figure 5:
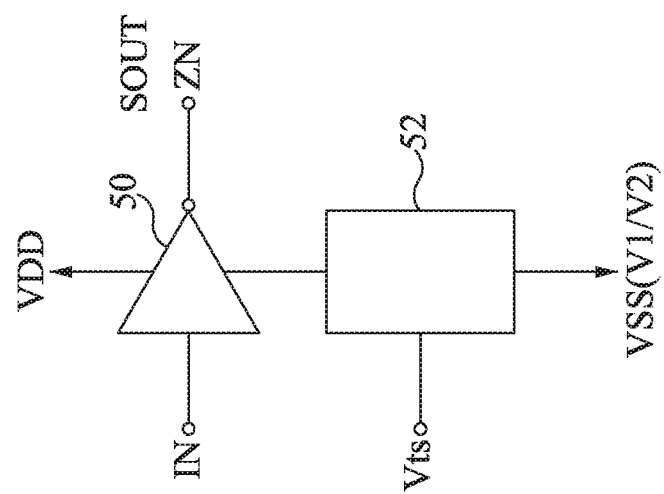
FIG. 5 is a schematic diagram of an oscillator of the device shown in FIG. 1, in accordance with an embodiment of the present disclosure.

FIG. 5 is a schematic diagram of an oscillator 12 of the device 10 shown in FIG. 1, in accordance with an embodiment of the present disclosure. Referring to FIG. 5, the oscillator 12 includes a digital delay cell 50 and an adjustment device 52.

The digital delay cell 50 operates under a power domain defined by a high extreme limit voltage and a low extreme limit voltage VSS. The high extreme limit voltage refers to the supply voltage VDD, and therefore is also labeled "VDD" for convenience. The digital delay 50 functions to generate the signal VOUT in a digital-signal form at the output ZN of the oscillator 12. In the present embodiment, the digital delay cell 50 includes an inverter. However, the present disclosure is not limited thereto. In other embodiments, the digital delay cell 50 includes any suitable digital device.

The adjustment device 52 functions to, based on the temperature-sensitive voltage Vts, adjust a range of the power domain under which the digital delay cell 50 operates, thereby adjusting a delay of the digital delay cell 50. In the present embodiment, the low extreme limit voltage VSS is adjusted. However, the present disclosure is not limited thereto. In some appropriate circuit designs, the high extreme limit voltage VDD is adjusted. Alternatively, in some embodiments, both the high extreme limit voltage VDD and the low extreme limit voltage VSS are adjusted based on the temperature-sensitive voltage Vts.

In operation, temperature is a first degree. Accordingly, the temperature-sensitive voltage Vts exhibits a first voltage level. In response to the first voltage level, the adjustment device 52 adjusts the low extreme limit voltage VSS to a first limit voltage level V1. Based on the first limit voltage level V1, a delay of the digital delay cell 50 is adjusted. The digital delay cell 50, based on the adjusted delay, generates the signal VOUT at a first oscillation frequency.

In another operation, temperature is a second degree. Accordingly, the temperature-sensitive voltage Vts exhibits a second voltage level. In response to the second voltage level, the adjustment device 52 adjusts the low extreme limit voltage VSS to a second limit voltage level V2 different from the first limit voltage level V1. Based on the second limit voltage level V2, the delay of the digital delay cell 50 is adjusted. The digital delay cell 50, based on the adjusted delay, generates the signal VOUT at a second oscillation frequency different from the first oscillation frequency.

The oscillation frequency is different as the temperature is different. As a result, temperature can be calculated based on the oscillation frequency. Moreover, the oscillation frequency and temperature have a linear relationship, which facilitates calculating temperature.

Moreover, the digital delay cell 50 and the adjustment device 52 of the device 10 are digital circuits, which will be illustrated in detail with reference to FIGS. 6 and 7. As such, the device 10 is able to be formed within digital devices, such as CPUs and GPUs. Consequently, the device 10 is able to accurately sense the temperature of the digital devices at any places of interest to a designer. Moreover, since the digital delay cell 12 is a digital circuit, the signal VOUT generated by the digital cell 12 is therefore a digital signal. As such, there is no need to prepare an ADC which would otherwise be required by an analog sensor, such as a thermal diode, to convert an analog signal to a digital signal. Furthermore, size of the device 10 is relatively small, and therefore is area efficient.

Figure 6:
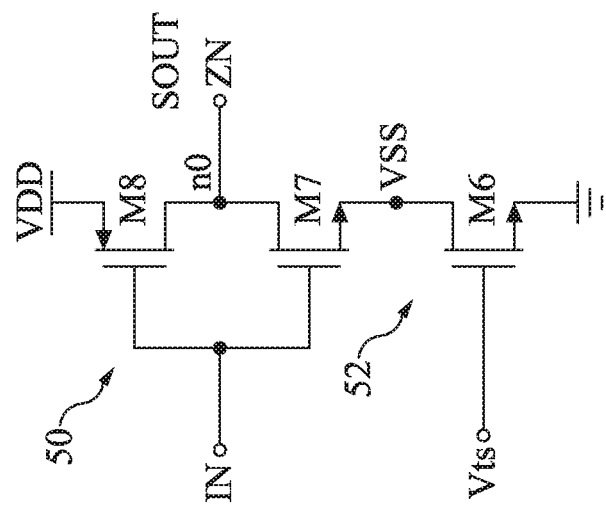
FIG. 6 is a circuit diagram of another oscillator of the device shown in FIG. 1, in accordance with an embodiment of the present disclosure.

FIG. 6 is a circuit diagram of another oscillator 62 of the device 10 shown in FIG. 1, in accordance with an embodiment of the present disclosure. Referring to FIG. 6, the adjustment device 52 includes a transistor M6, and the digital delay cell 50 includes transistors M7 and M8.

The transistor M6 functions to adjust a drain voltage of the transistor M6 based on the temperature-sensitive voltage Vts. In further detail, a gate of the transistor M6 is controllable by the temperature-sensitive voltage Vts. A drain voltage of the transistor M6 serves as the low extreme limit voltage VSS. A drain of the transistor M6 is directly connected to a source of the transistor M7. In the present embodiment, the transistor M6 includes an NMOS transistor. However, the present disclosure is not limited thereto. In some embodiments, the transistor M6 includes a PMOS transistor. In some embodiments, the transistor M6 includes another suitable device, such as an FET, a power FET, a DMOS transistor, an IGBT, etc. With the transistor M6, the power domain can be adjusted based on the temperature-sensitive voltage Vts, as will be disclosed in detail below.

The transistors M7 and M8 form the delay cell 50. In the present embodiment, the transistors M7 and M8 includes an NMOS transistor and a PMOS transistor, respectively. The source of the transistor M8 receives the high extreme limit voltage VDD of the power domain. The source of the transistor M7 receives the low extreme limit voltage VSS of the power domain. The signal VOUT is provided at drains of the transistor M7 and M8. In some embodiments, the transistor M7 includes a PMOS transistor. In some embodiments, the transistor M7 includes another suitable device, such as an FET, a power FET, a DMOS transistor, an IGBT, etc. In some embodiments, the transistor M8 includes an NMOS transistor. In some embodiments, the transistor M8 includes another suitable device, such as an FET, a power FET, a DMOS transistor, an IGBT, etc.

In operation, when temperature is relatively high, a voltage level of the temperature-sensitive voltage Vts is relatively high. In response to the relatively high voltage level, the transistor M6 conducts relatively well. The drain voltage, serving as the low extreme limit voltage VSS, of the transistor M6 is pulled down to a voltage level relatively close to a reference ground. In response to the relatively low drain voltage, given that the high extreme limit voltage VDD kept unchanged, a voltage cross the transistors M7 and M8 is relatively high. As such, a delay is relatively short. Therefore, the oscillation frequency of the signal VOUT is relatively high.

In another operation, when temperature is relatively low, a voltage level of the temperature-sensitive voltage Vts is relatively low. In response to the relatively low voltage level, the transistor M6 conducts relatively not well. The drain voltage, serving as the low extreme limit voltage VSS, of the transistor M6 is pulled down to a voltage level relatively not close to a reference ground. In response to the relatively high drain voltage, given that the high extreme limit voltage VDD kept unchanged, a voltage cross the transistors M7 and M8 is relatively low. As such, a delay is relatively long. Therefore, the oscillation frequency of the signal VOUT is relatively low.

Figure 7:
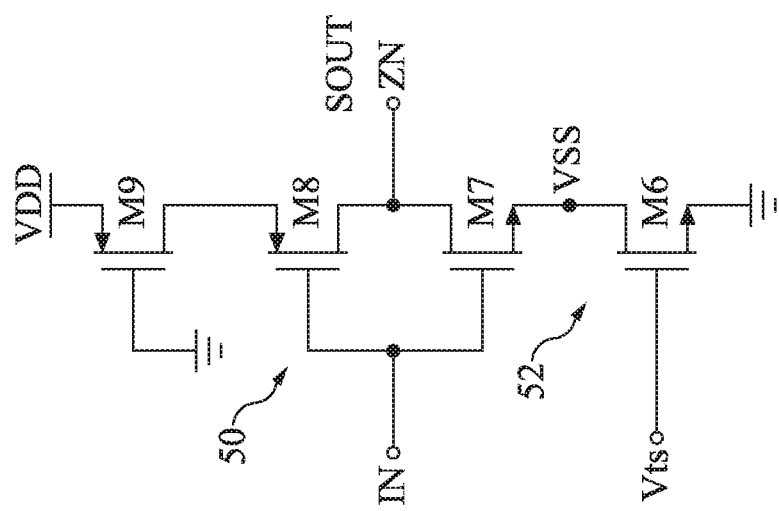
FIG. 7 is a circuit diagram of yet another oscillator of the device shown in FIG. 1, in accordance with an embodiment of the present disclosure.

FIG. 7 is a circuit diagram of yet another oscillator 72 of the device 10 shown in FIG. 1, in accordance with an embodiment of the present disclosure. Referring to FIG. 7, the oscillator 72 is similar to the oscillator 62 described and illustrated with reference to FIG. 6 except that, for example, the oscillator 72 further includes a transistor M9.

The transistor M9 includes a PMOS transistor. A source of the transistor M9 receives the high extreme limit voltage VDD. A gate of the transistor M9 receives a reference ground. A drain of the transistor M9 is directly connected to the source of the transistor M8. With the transistor M9, the oscillation frequency is more sensitive to temperature.

Figure 8:
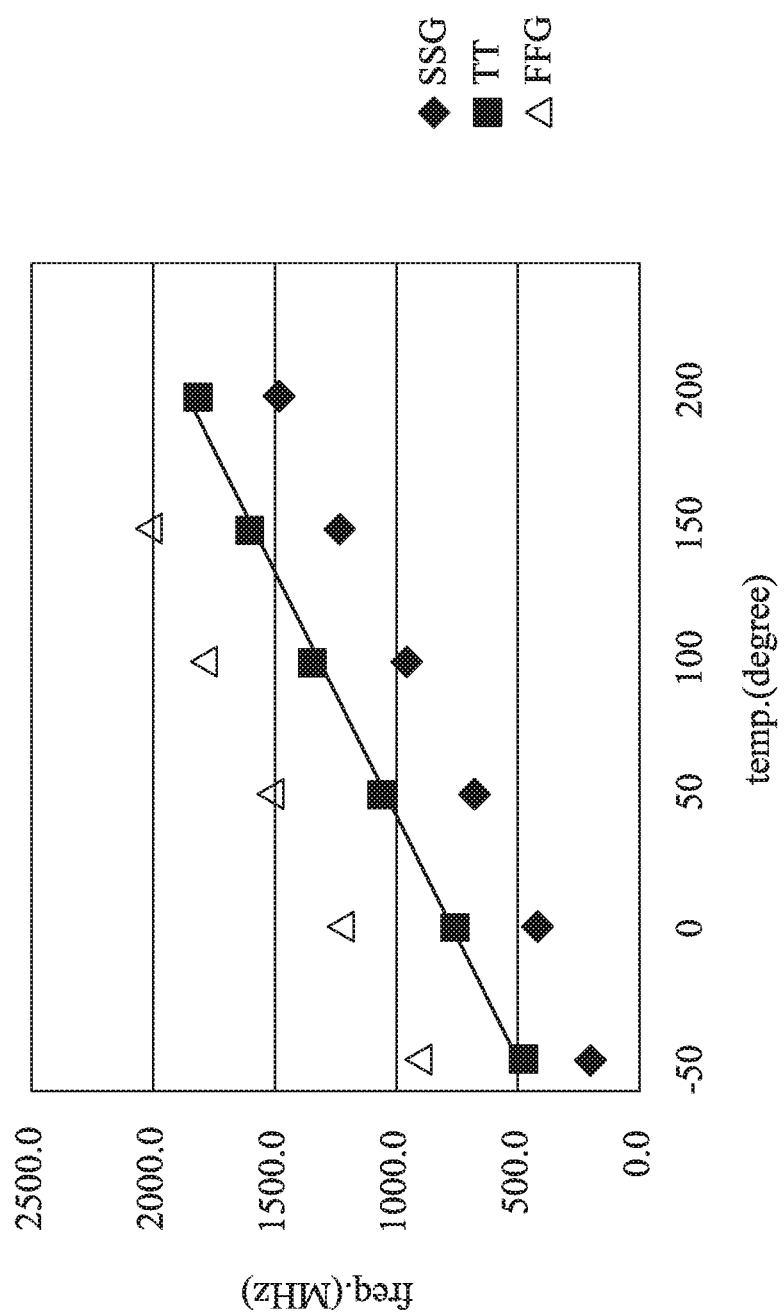
FIG. 8 is a schematic diagram showing simulation results of the device shown in FIG. 1, in accordance with an embodiment of the present disclosure.

FIG. 8 is a schematic diagram showing simulation results of the device shown in FIG. 1, in accordance with an embodiment of the present disclosure. Referring to FIG. 8, a horizontal axis represents a degree in Celsius; and a vertical axis represents the oscillation frequency of the signal VOUT. Simulation is performed under three corner cases, a slow-to-slow global (SSG) corner case, a typical-to-typical (TT) corner case, and a fast-to-fast global (FFG) corner case. Simulation results under the SSG corner case are depicted as triangle. Simulation results under the TT corner case are depicted as rectangular. Simulation results under the FFG corner case are depicted as diamond.

As shown in FIG. 8, the oscillation frequency and temperature have a linear relationship, which facilitates calculating temperature. A sensitivity of the device 10 is about 6.8 MHz/degree. Operation range of temperature ranges from about −40° C. to about −20° C.

Figure 9:
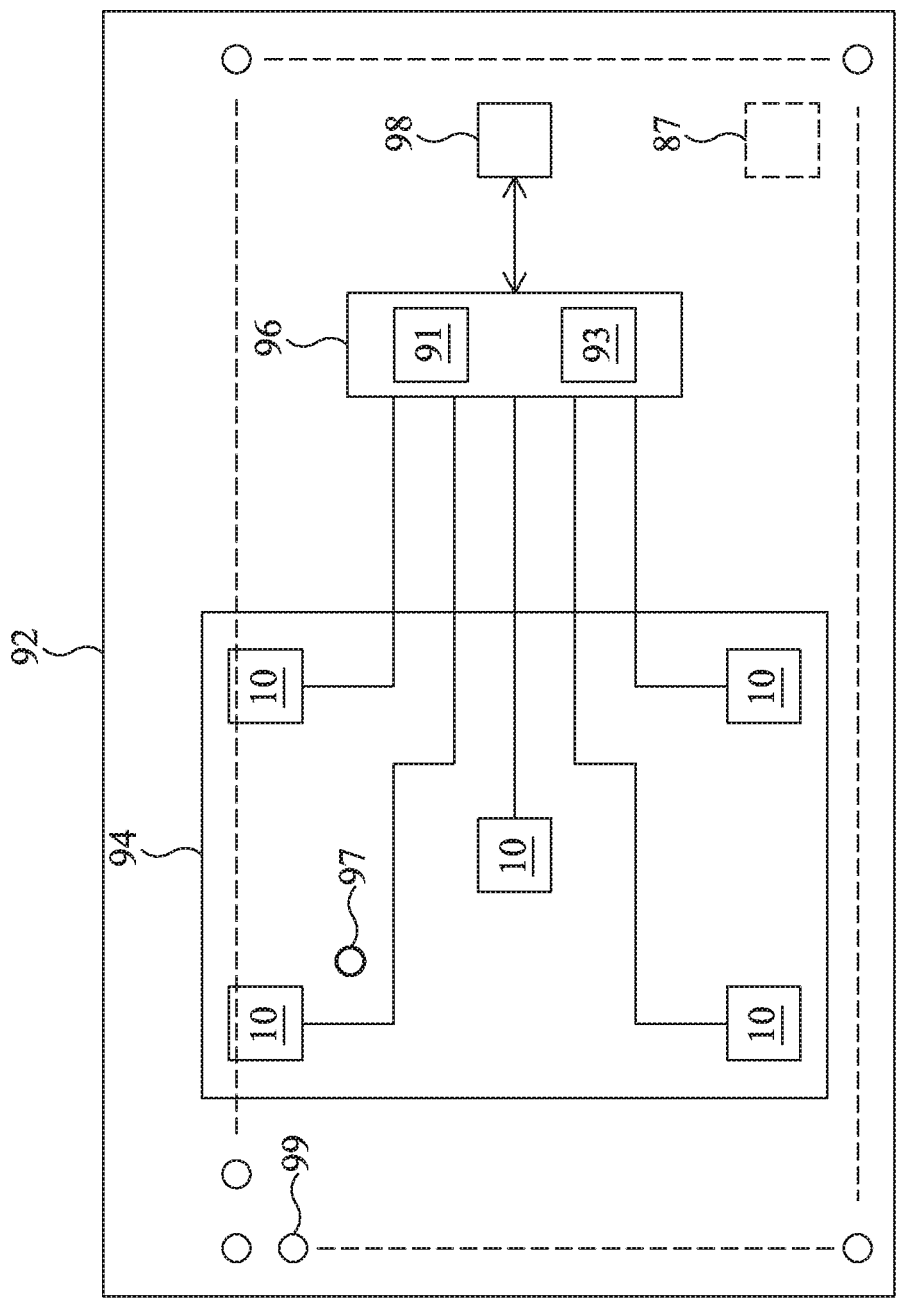
FIG. 9 is a top view of a system-on-a-chip (SOC) including the device shown in FIG. 1, in accordance with an embodiment of the present disclosure.

FIG. 9 is a top view of a system-on-a-chip (SOC) 92 including the device 10 shown in FIG. 1, in accordance with an embodiment of the present disclosure. Referring to FIG. 9, the SOC 92 includes a digital device 94, such as CPUs and GPUs. Since the device 10 and the digital device 94 are digital device, the device 10 can be formed within the digital device 94. In particular, the device 10 can be formed at a place near a spot of interest to a designer. For example, a circuit designer would like to know temperature at a spot 97 within the digital device 10. The device 10 can be formed at the left upper corner of the digital device 10 so as to accurately sense temperature at the spot 97.

In some existing semiconductor devices, a thermal diode is adopted to sense temperature of the digital device 94. The analog device is required to be arranged far from the digital devices to avoid signal interference. Since the thermal diode is spaced apart from the digital devices by a relatively large distance, for example, at a place 87 depicted in FIG. 9, the thermal diode may not be able to accurately sense temperature of the digital circuits. Furthermore, size of the thermal diode is relatively large, and therefore is area inefficient.

Moreover, in addition to the digital device 94 and the device 10, the SOC 92 further includes a monitor device 96 and a processing system 98. The monitor device 96 and the processing system 98 have the same interface, such as a PL301 interface. As such, the monitor device 96 and the processing system 98 are able to communicate with each other. In an embodiment, the monitor device 96 includes an on-line interaction monitor module (OLIMM).

The monitor device 96 includes an e-fuse 91 and a register bank 93. The e-fuse 91 stores two sets of correlation between an oscillation frequency and temperature, which have been calibrated.

The register bank 93 stores information on an oscillation frequency produced by the device 10, and registers the two sets of correlation.

When it is required to know the present temperature, the processing system 98 calculates the present temperature based on the two sets of correlation stored by the e-fuse 91 and the present oscillation frequency stored by the register bank 93.

In operation, the processing system 98 requests the two sets of correlation. The two sets of correlation stored in the e-fuse 91 are registered to the register bank 93. The processing device 98 accesses the register bank 93 to obtain the two sets of correlation. Whenever the device 10 accesses the register bank 93, the register bank 93 stores the new oscillation frequency from the device 10.

With the register bank 93 and the processing system 98, temperature can be calculated in time, which means that an on-line interaction operation can be completed. Moreover, oscillation frequency obtained from the device 10 can be registered in the register bank 93. As such, there is no need to reserve bumps 99 to transmit the information on the oscillation frequency to another work station. As a result, usage of the bumps 99 is relatively efficient.

Contrarily, in some existing approaches, it is required to reserve bumps to transmit information on a voltage, or current obtained from a thermal diode to another work station. As a result, an on-line interaction operation cannot be completed. Moreover, usage of bumps is relatively inefficient.

Figure 10:
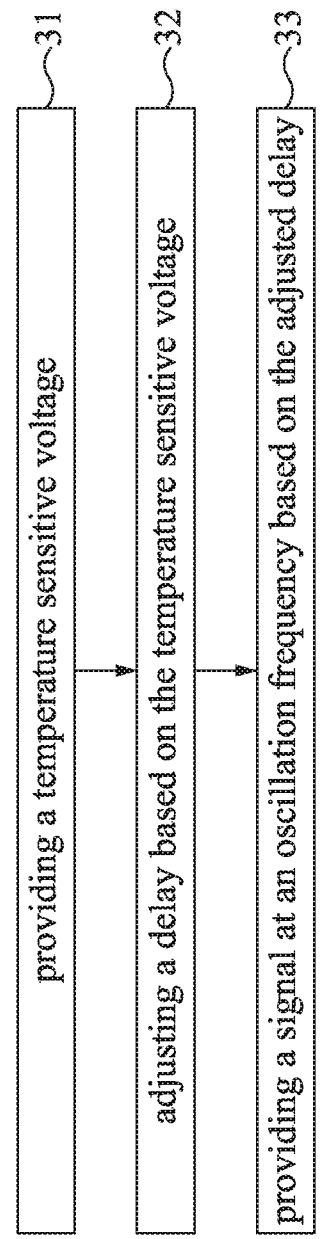
FIG. 10 is a flow diagram showing a method of operating a device, in accordance with an embodiment of the present disclosure.

FIG. 10 is a flow diagram of a method 30 operating a device, in accordance with an embodiment of the present disclosure. Referring to FIG. 10, the method 30 includes operations 31, 32 and 33. In operation 31, a temperature-sensitive voltage is provided. In operation 32, a delay is, based on the temperature-sensitive voltage, adjusted. In operation 33, a signal at an oscillation frequency is, based on the adjusted delay, provided.

Figure 11:
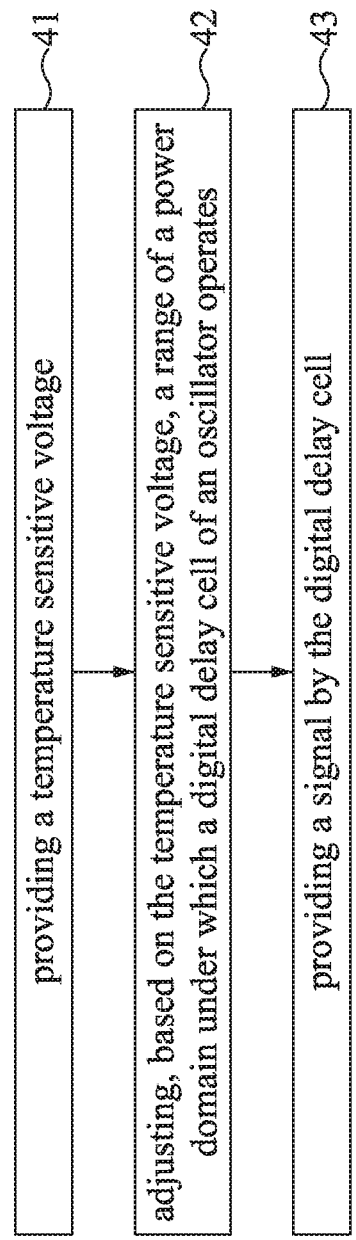
FIG. 11 is a flow diagram showing another method of operating a device, in accordance with an embodiment of the present disclosure.

FIG. 11 is a flow diagram of another method 40 operating a device, in accordance with an embodiment of the present disclosure. Referring to FIG. 11, the method 40 includes operations 41, 42 and 43. In operation 41, a temperature-sensitive voltage is provided. In operation 42, a range of a power domain under which a digital delay cell of an oscillator operates is, based on the temperature-sensitive voltage, adjusted. In operation 43, a signal is provided by the digital delay cell.

Some embodiments have one or a combination of the following features and/or advantages. In some embodiments, a device is provided. The device includes a sensor and an oscillator. The sensor provides a temperature-sensitive voltage. The oscillator includes a digital delay cell and an adjustment device. The adjustment device, based on the temperature-sensitive voltage, adjusts a delay of the digital delay cell, wherein the digital delay cell produces, based on the adjusted delay, a signal at an oscillation frequency.

In some embodiments, a device is provided. The device includes a sensor configured to provide a temperature-sensitive voltage; an oscillator including: a digital delay cell; an adjustment device configured to adjust, based on the temperature-sensitive voltage, a range of a power domain under which the digital delay cell operates, wherein the digital delay cell produces a signal at an oscillation frequency In some embodiments, a method is provided. The method includes: providing a temperature-sensitive voltage; adjusting a delay based on the temperature-sensitive voltage; and providing a signal at an oscillation frequency based on the adjusted delay.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a sensor configured to provide a temperature-sensitive voltage, the sensor including:
        a first transistor, being a diode-connected transistor;
        a second transistor, a gate of which is controllable by an enable signal, wherein a drain of the second transistor is connected to a source of the first transistor; and
        a current source configured to control the first transistor, wherein the current source further comprises:
            a third transistor, a drain of which is directly connected to a drain of the first transistor, the third transistor being a diode-connected transistor; and
    an oscillator including:
        a digital delay cell; and
        an adjustment device configured to, based on the temperature-sensitive voltage, adjust a delay of the digital delay cell,
        wherein the digital delay cell produces, based on the adjusted delay, a signal at an oscillation frequency.

2. The device as claimed in claim 1, wherein the adjustment device is configured to adjust, based on the temperature-sensitive voltage, a power domain under which the digital delay cell operates.

3. The device as claimed in claim 1, further comprising a voltage divider, wherein the voltage divider includes a plurality of transistors cascode connected, wherein gates of the plurality of transistors cascode connected are controllable by the enable signal.

4. The device as claimed in claim 3, wherein a source voltage of a top transistor of the plurality of transistors cascode connected serves as the temperature-sensitive voltage.

5. A device, comprising:
    a sensor configured to provide a temperature-sensitive voltage, the sensor including:
        a voltage divider configured to generate the temperature-sensitive voltage wherein the voltage divider includes a plurality of transistors cascode connected, and gates of the plurality of transistors cascode connected are controllable by an enable signal; and
    an oscillator including:
        a digital delay cell; and
        an adjustment device configured to adjust, based on the temperature-sensitive voltage, a range of a power domain under which the digital delay cell operates,
        wherein the digital delay cell produces a signal at an oscillation frequency.

6. The device as claimed in claim 5, wherein the power domain is defined by a high extreme limit voltage and a low extreme limit voltage, the adjustment device configured to, based on the temperature-sensitive voltage, adjust the low extreme limit voltage.

7. The device as claimed in claim 5, wherein the adjustment device includes a seventh transistor, wherein a gate of the seventh transistor is controllable by the temperature-sensitive voltage, and a drain voltage of the seventh transistor serves as a low extreme limit voltage.

8. The device as claimed in claim 7, wherein the digital delay cell includes an inverter.

9. The device as claimed in claim 8, wherein the inverter includes an eighth transistor and a ninth transistor, wherein a source of the eighth transistor is directly connected to a drain of the seventh transistor, and a source of the ninth transistor receives a high extreme limit voltage of the power domain.

10. The device as claimed in claim 9, wherein the signal is provided at drains of the ninth transistor and the eighth transistor.

11. The device as claimed in claim 7, wherein the sensor includes:
    a current source; and
    a first transistor being a diode-connected transistor and controlled by the current source, a gate voltage of the first transistor associated with a gate voltage of the seventh transistor.

12. A method, comprising:
    providing a temperature-sensitive voltage by dividing a gate voltage of a first transistor by means of a voltage divider, the voltage divider including a plurality of transistors cascode connected, gates of the plurality of transistors cascode connected controllable by an enable signal;
    adjusting a delay based on the temperature-sensitive voltage; and
    providing a signal at an oscillation frequency based on the adjusted delay.

13. The method as claimed in claim 12, further comprising:
    adjusting, based on the temperature-sensitive voltage, a range of a power domain under which a digital delay cell of an oscillator operates; and
    providing the signal by the digital delay cell.

14. The method as claimed in claim 12, further comprising:
    controlling the first transistor by a current source, wherein the first transistor is a diode-connected transistor.

15. The device as claimed in claim 1, wherein the drain of the second transistor is directly connected to the source of the first transistor.

16. The device as claimed in claim 11, wherein the voltage divider is configured to transform the gate voltage of the first transistor into the temperature-sensitive voltage, and wherein the gate of the seventh transistor receives the temperature-sensitive voltage.

17. The device as claimed in claim 1, wherein the current source is configured to generate a current to flow through the first transistor, wherein a magnitude of the current is independent of temperature.

18. The device as claimed in claim 1, wherein the current source is configured to generate a current to flow through the first transistor, wherein a magnitude of the current is sensitive to temperature.

19. The device as claimed in claim 1, wherein the sensor further includes a voltage divider configured to transform a gate voltage of the first transistor into the temperature-sensitive voltage.

20. The device as claimed in claim 19, wherein the voltage divider is directly connected to the current source.

21. The device as claimed in claim 19, wherein the voltage divider is directly connected to a gate of the first transistor.

* * * * *